United States Patent
Liu et al.

(10) Patent No.: US 10,450,652 B2
(45) Date of Patent: Oct. 22, 2019

(54) SYNTHESIS OF STRUCTURED CARBON MATERIAL FROM ORGANIC MATERIALS

(71) Applicant: University of Pittsburgh—Of the Commonwealth System of Higher Education, Pittsburgh, PA (US)

(72) Inventors: Haitao Liu, Pittsburgh, PA (US); Feng Zhou, New York, NY (US)

(73) Assignee: University of Pittsburgh—Of the Commonwealth System of Higher Education, Pittsburgh, PA (US)

( * ) Notice: Subject to any disclaimer, the term of this patent is extended or adjusted under 35 U.S.C. 154(b) by 0 days.

(21) Appl. No.: 15/487,696

(22) Filed: Apr. 14, 2017

(65) Prior Publication Data

US 2017/0298517 A1 Oct. 19, 2017

Related U.S. Application Data

(60) Provisional application No. 62/322,337, filed on Apr. 14, 2016.

(51) Int. Cl.
*C23C 16/40* (2006.01)
*C23C 16/455* (2006.01)
*C23C 18/12* (2006.01)
*C01B 32/90* (2017.01)

(52) U.S. Cl.
CPC ........ *C23C 16/45525* (2013.01); *C01B 32/90* (2017.08); *C23C 16/403* (2013.01); *C23C 18/1283* (2013.01); *C01P 2002/82* (2013.01); *C01P 2004/04* (2013.01)

(58) Field of Classification Search
CPC ............ C23C 16/45525; C23C 16/403; C23C 18/1283; C01B 32/90; C01P 2004/04; C01P 2002/82
See application file for complete search history.

(56) References Cited

PUBLICATIONS

Zhou, Feng, et al. "Programmably shaped carbon nanostructure from shape-conserving carbonization of DNA." ACS nano 10.3 (2016): 3069-3077.*
Morishita, T., et al. "A review of the control of pore structure in MgO-templated nanoporous carbons." Carbon 48.10 (2010): 2690-2707.*
Sonobe, Naohiro, Takashi Kyotani, and Akira Tomita. "Carbonization of polyacrylonitrile in a two-dimensional space between montmorillonite lamellae." Carbon 26.4 (1988): 573-578.*
Surwade, Sumedh P et al.; Nanoscale Growth and Patterning of Inorganic Oxides Using DNA Nanostructure Templates, J. Am. Chem. Soc. 2013, 135, 6778-6781.
Zhou, Feng et al., Programmably Shaped Carbon Nanostructure from Shape-Conserving Carbonization of DNA; ACS Nano 2016, 10, 3069-3077.
Tian, Cheng et al.; DNA Nanostructures-Mediated Molecular Imprinting Lithography; ACS Nano 2017, 11, 227-238.

* cited by examiner

*Primary Examiner* — Richard M Rump
(74) *Attorney, Agent, or Firm* — Bartony & Associates, LLC

(57) ABSTRACT

A method of forming a carbonized composition includes providing an organic composition, forming a protective layer over the organic composition, increasing temperature to carbonize the organic composition and for a period of time to form the carbonized composition, and removing the protective layer from the carbonized composition.

15 Claims, 6 Drawing Sheets

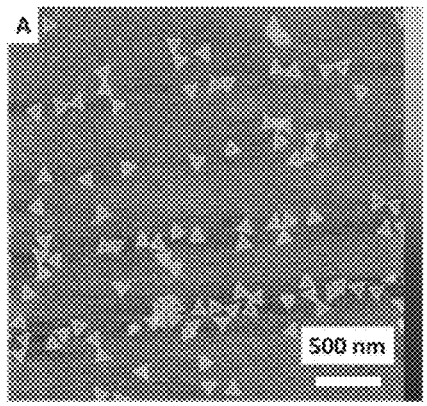 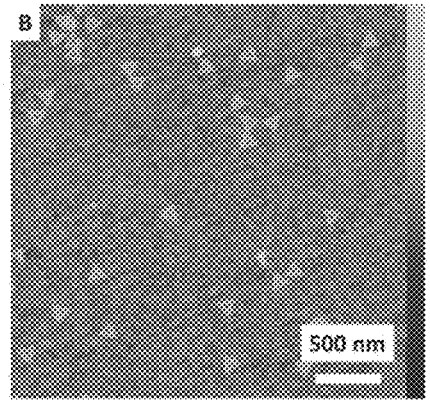
Fig. 3A  Fig. 3B
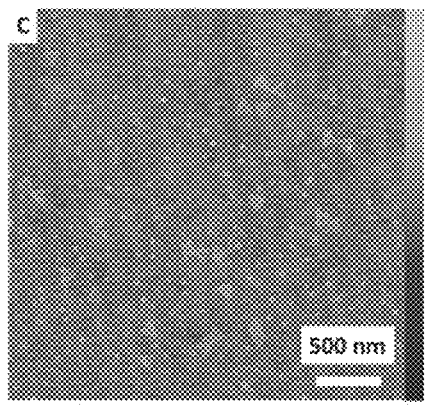 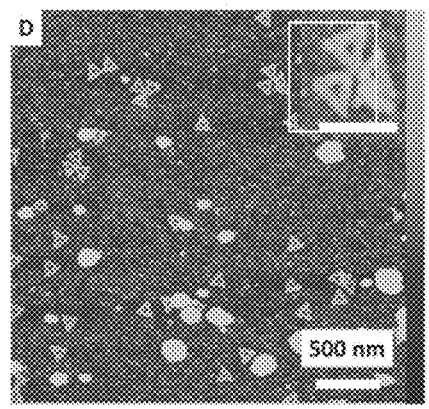
Fig. 3C  Fig. 3D
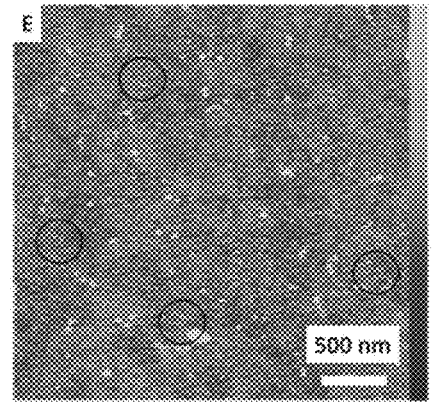
Fig. 3E

SYNTHESIS OF STRUCTURED CARBON MATERIAL FROM ORGANIC MATERIALS

CROSS-REFERENCE TO RELATED APPLICATIONS

This application claims benefit of U.S. Provisional Patent Application Ser. No. 62/322,337, filed Apr. 14, 2016, the disclosure of which is incorporated herein by reference.

GOVERNMENTAL INTEREST

This invention was made with government support under grant no. FA9950-13-1-0083 awarded by the Air Force Office of Scientific Research; grant no. CHE-1507629 awarded by the National Science Foundation and grant nos. N000141310575 and N000141512520 awarded by the Office of Naval Research. The government has certain rights in this invention.

BACKGROUND

The following information is provided to assist the reader in understanding technologies disclosed below and the environment in which such technologies may typically be used. The terms used herein are not intended to be limited to any particular narrow interpretation unless clearly stated otherwise in this document. References set forth herein may facilitate understanding of the technologies or the background thereof. The disclosure of all references cited herein are incorporated by reference.

Graphitic carbon materials (indicating sp2 hybridized carbon materials) and other forms and/or allotropes of carbon have found a wide range of applications, such as low-density structures, energy storage structures, and thermal management structures as a result of material properties including, for example, strength-to-density ratio, porosity, surface area, thermal conductivity, electrical conductivity, or a combination thereof. The internal structure of a carbon material largely defines its properties. Therefore, it is desirable to design and synthesize graphitic/carbon materials with a predetermined structure which may be optimized for a particular use.

DNA can be readily fabricated into a predetermined, arbitrary-shaped one-dimensional (1D), two-dimensional (2D) or three-dimensional (3D) structures in nanoscale using currently available DNA nanotechnology. As a template, however, a major limitation of pure DNA nanostructure lies in its limited chemical stability. Hence, almost all reported DNA-based nanofabrications were either based on solution chemistry or conducted at close to room temperature For example, solution phase metallization on DNA has been demonstrated using various metals (e.g., Ag, Cu, Ni and Au) and can be made site-specific through modification of DNA nanostructure with binding sites that accept DNA-modified Au or Ag nanoparticles. Vapor phase deposition of metals onto DNA has been used to pattern vapor-phase deposited metal. DNA nanostructures may also be used direct the etching and deposition of $SiO_2$ at room temperature. Although, relatively high quality pattern transfer may be achieved in such low-reaction processes, the resultant inorganic nanostructures are often of low crystallinity.

High temperature (>500° C.) is often needed for the synthesis and crystallization of most inorganic materials, such as porous carbon. The possibility of using DNA nanostructure to direct chemical synthesis at this extreme temperature range could create new opportunities in materials design and fabrication. However, studies have shown that DNA begins to degrade at temperatures as low as 130° C. and may completely degrade at temperatures around 190. It is thus seemingly not possible to achieve pattern transfer from DNA nanostructures under these conditions.

SUMMARY

In one aspect, a method of forming a carbonized composition includes providing an organic composition, forming a protective layer over the organic composition, increasing temperature to carbonize the organic composition and for a period of time to form the carbonized composition, and removing the protective layer from the carbonized composition. In a number of embodiments, the organic composition includes a nucleic acid. The organic composition may, for example, consist of a nucleic acid. The nucleic acids hereof may for example be DNA. The nucleic acid may, for example, be formed to have a predetermined shape or conformation. The predetermined shape or conformation of the nucleic acid may, for example, be substantially maintained in the carbonized composition. In that regard, the height after carbonization (of a nucleic acid or other organic composition) may be within 80%, 90%, 95% or even 98% of the height before carbonization. The nucleic acid or other organic composition may, for example, be deposited upon a substrate before forming the protective layer over the organic composition.

The carbonized composition may, for example, be a porous carbon material. The temperature may, for example, be increased to a temperature within the range of approximately 780° C. to approximately the melting point of the protective layer (2072° C. in the case of $Al_2O_3$, for example) or 780° C. to 1000° C. to carbonize the organic composition.

The protective layer may be deposited via a thin film deposition technique. The protective layer may, for example, be impermeable to decomposition gases of the organic material during carbonization. In a number of embodiments, the protective layer is deposited via atomic layer deposition, vacuum deposition, sputtering, chemical vapor deposition or laser assisted deposition. In a number of embodiments, the protective layer is deposited via atomic layer deposition. The thickness of the protective layer may, for example, be in the range of 2 nm to 100 micrometers. In a number of embodiments, the protective layer comprises $Al_2O_3$. The protective layer may, for example, be removed via etching with a composition which removes the protective layer without substantially damaging the carbonized material. The etching composition may, for example, comprise $H_3PO_4$.

In another aspect, a carbonized composition is formed by a process including providing an organic composition formed into a predetermined configuration, forming a protective layer over the organic composition, increasing temperature to carbonize the organic composition and form the carbonized composition, and removing the protective layer from the carbonized composition, wherein the carbonized composition has substantially the predetermined configuration. In a number of embodiments, the organic composition includes a nucleic acid. In a number of embodiments, the organic composition consists of a nucleic acid. The nucleic acid may, for example, be DNA.

In a further aspect, a composition includes a nucleic acid; and a protective layer deposited by atomic layer deposition, vacuum deposition, sputtering, chemical vapor deposition or laser assisted deposition over the nucleic acid. In a number of embodiments, the protective layer is deposited via atomic layer deposition. The thickness of the protective layer may, for example, be in the range of 2 nm to 100 micrometers. The protective layer may, for example, be impermeable to decomposition gases of the organic material during carbonization. In a number of embodiments, the protective layer comprises $Al_2O_3$. The protective layer may, for example, be removed via etching with a composition which removes the protective layer without substantially damaging the carbonized material. The etching composition may, for example, comprise $H_3PO_4$.

In one aspect, a method of forming a carbonized composition includes providing an organic composition, forming a protective layer over the organic composition, increasing the temperature to carbonize the organic composition and form the carbonized composition, and removing the protective layer from the carbonized composition. In a number of embodiments, the organic composition includes or consists of a nucleic acid (for example, DNA). In a number of embodiments, the organic composition is formed to have a predetermined shape, structure or conformation (for example, nanostructure). In a number of embodiments, the predetermined shape, structure or conformation (for example, nanostructure) of the organic composition is substantially maintained in the carbonized composition. The organic composition may be deposited upon a substrate before forming the protective layer thereover.

In another aspect, a carbonized composition is formed by a process including providing an organic composition, forming a protective layer over the organic composition, increasing temperature to carbonize the organic composition and form the carbonized composition, and removing the protective layer from the carbonized composition.

In a further aspect, a method of forming a carbonized composition includes providing a nucleic acid composition and increasing temperature to carbonize the nucleic acid composition and form the carbonized composition. In a number of embodiments, the method further includes forming a protective layer over the nucleic acid composition before increasing temperature and removing the protective layer from the carbonized composition. The nucleic acid composition may, for example, include or consist of DNA.

In still a further aspect, a carbonized composition is formed by a process including providing a nucleic acid composition and increasing temperature to carbonize the nucleic acid composition and form the carbonized composition.

The present devices, systems, and methods, along with the attributes and attendant advantages thereof, will best be appreciated and understood in view of the following detailed description taken in conjunction with the accompanying drawings.

BRIEF DESCRIPTION OF THE DRAWINGS

in FIGS. 1G and 1I, the horizontal axis represents the 5 steps of the fabrication process: (1) after deposition on the Si substrate, (2) after ALD of $Al_2O_3$ film, (3) after annealing, (4) after removal of $Al_2O_3$ film and (5) after UV/Ozone treatment.

FIG. 3A illustrates an AFM topographic image of a DNA triangle after deposition on top of Si substrate.

FIG. 3B illustrates an AFM topographic image of a DNA triangle after ALD of $Al_2O_3$ film.

FIG. 3C illustrates an AFM topographic image of a DNA triangle after annealing at 800° C.

FIG. 3D illustrates an AFM topographic image of a DNA triangle after removal of the $Al_2O_3$ film, wherein the scale bar for the inset is 200 nm.

FIG. 3E illustrates an AFM topographic image of a DNA triangle after UVO treatment.

DETAILED DESCRIPTION

Figure 1A:
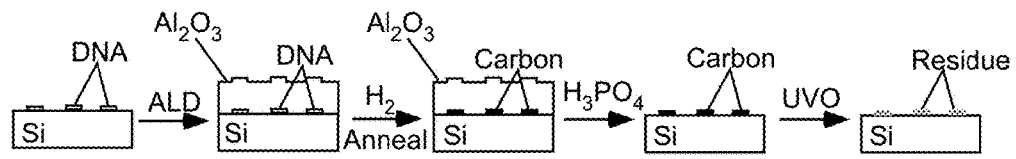
FIG. 1A illustrates schematically an embodiment of a methodology hereof for conserving shape or conformation during carbonization of one-dimensional or 1D DNA structure.

The present devices, systems, methods and compositions, along with the attributes and attendant advantages thereof, will best be appreciated and understood in view of the following description taken in conjunction with any accompanying drawings.

In a number of embodiments, devices, systems, methods and compositions hereof provide for synthesis of carbonized materials/compositions from organic materials/compositions such as deoxyribonucleic acid (DNA). The present studies demonstrate that organic materials such as DNA are useful as material templates for high temperature solid state chemistries.

It will be readily understood that the components of the embodiments, as generally described herein and illustrated in the figures hereof, may be arranged and designed in a wide variety of different configurations in addition to the described example embodiments. Thus, the following description of the example embodiments is not intended to limit the scope of the embodiments, as claimed, but is merely descriptive of representative embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

As used herein and in the appended claims, the singular forms "a," "an", and "the" include plural references unless the context clearly dictates otherwise. Thus, for example, reference to "an organic composition" includes a plurality of such organic compositions and equivalents thereof known to those skilled in the art, and so forth, and reference to "the organic composition" is a reference to one or more such organic compositions and equivalents thereof known to those skilled in the art, and so forth. Recitation of ranges of values herein are merely intended to serve as a shorthand method of referring individually to each separate value falling within the range. Unless otherwise indicated herein, and each separate value as well as intermediate ranges are incorporated into the specification as if it were individually recited herein. All methods described herein can be performed in any suitable order unless otherwise indicated herein or otherwise clearly contraindicated by the text.

In a number of embodiments hereof, one first identifies a candidate for the organic material/composition, and then converts the organic material/composition to graphitic or carbonized material/composition with the shape/conformation of the organic material well conserved. As used herein, "graphitic carbon" indicates sp2 hybridized carbon material. In a number of embodiments, carbonization of organic material in the methods hereof resulted in porous carbon nanostructure which was found to include approximately 70% graphitic carbon and approximately 30% of other forms of carbon when the organic material was carbonized in a temperature range of approximately 780° C. to 1000° C. Carbonization may, for example, occur at temperatures above approximately 500° C. In a number of embodiments hereof, the temperature of carbonization (annealing) was at least 700° C., at least 750° C. or at least 780° C. The upper temperature is limited by the melting point of the protective layer.

For the organic material in a number of embodiments, representative studies hereof included two-dimensional (2D) and three-dimensional (3D) DNA because it can be readily fabricated into a predetermined, arbitrary-shaped structure in nanoscale using currently available DNA nanotechnology. DNA fabrication techniques provide a high degree of control over size, shape and resolution (with a current theoretical resolution of approximately 2 nm). After formation of the 2D or 3D DNA structure, one then converts the DNA structure to a graphitic or carbonized structure (nanostructure), while preserving or conserving the 2D or 3D structure/conformation of the original DNA. Traditionally, DNA applications can only be conducted at low temperature processes or solution phase reactions as a result of the limited chemical stability of DNA. However, carbonization from DNA to graphitic materials requires high temperature in gas phase. Organic materials (for example, polymers) other than DNA may also be used in the formation of the organic compositions/precursors hereof. Likewise, hybrid materials including organic materials other than nucleic acids in combination with nucleic acids (for example, DNA) may be used.

As used herein, the terms "nucleic acid" refers to biopolymers, or large biomolecules made from monomers known as nucleotides. As used herein, the term "polymer" refers to a chemical compound that is made of a plurality of small molecules or monomers that are arranged in a repeating structure to form a larger molecule. Polymers may occur naturally or be formed synthetically. The use of the term "polymer" encompasses homopolymers as well as copolymers. The term "copolymer" is used herein to include any polymer having two or more different monomers. Copolymers may, for example, include alternating copolymers, periodic copolymers, statistical copolymers, random copolymers, block copolymers, graft copolymers etc. As used herein, the term "carbonize" refers to the conversion of a carbon-containing, organic material into a carbon composition at elevated temperature.

To overcome the limitations of the temperature stability of DNA and/or other organic materials, in a number of representative embodiments hereof, the organic material (for example, DNA) structure/layer was protected with a thin protective film during the high temperature reaction and removed the protective film to obtain the graphitic or carbonized material afterwards. The protective film provides a diffusion barrier to prevent the organic material/DNA from diffusing into the environment, and also maintains the structure/shape of organic material/DNA unchanged during the high temperature reaction in forming the carbonized material. The material of the protective layers used herein should be thermally stabile at the high temperatures required to carbonize the precursor organic materials/structures (for example, 780 to 1000° C.). Moreover, the materials of the protective layers should be chemically inert (that is, unreactive with the precursor organic composition and with the carbonized composition or product). The protective layer may also be removable using a technique that does not substantially affect the structure of conformation of the carbonized composition. Examples of suitable materials for use in protective layers hereof include, but are not limited to inorganic oxides such as aluminum oxide and silicon oxide. Aluminum oxide may, for example, be removed by $H_3PO_4$ etching to expose the carbonized composition.

The protective layer may, for example, be formed via a thin film deposition technique such as atomic layer deposition. Thin film deposition techniques may, for example, be used to apply a thin film of protective material having a thickness in the range of approximately few nanometers to about 100 micrometers, or the thickness of a few atoms.

Decreasing film thickness may provide cost savings, but the film thickness should also be chosen to provide stability of the film in preventing diffusion of the material and in maintaining the underlying structure. Suitable ranges of thickness of the protectively material layer are readily determined for a particular material. Protective layer thickness of approximately 20 nm were, for example, found to be suitable for aluminum oxide ($Al_2O_3$) in a number of studies hereof. One low temperature, chemical vapor deposition (CVD) was found to produce films with high porosity, which did not result in high yield carbonization. Atomic layer deposition, vacuum deposition, sputtering, other chemical vapor deposition techniques and laser assisted deposition may, however, provide dense films which are generally impermeable to gases produced during carbonization of DNA.

Almost any organic materials can be carbonized using the methodologies disclosed herein, including, but not limited to, sugar, synthetic polymers, cellulose and DNA. Among them, the best substrates for carbonization include those with aromatic rings. DNA is composed of three major components including a phosphate backbone, a sugar, and four bases. Among the three components, sugar is known to carbonize to produce amorphous carbon. The four bases are aromatic and structurally similar to a large number of compounds (for example, polyimides) that carbonize. However, bulk DNA decomposes to produce gaseous products when heated to temperature above 130° C., making it a challenge to achieve pattern transfer from DNA nanostructure at typical carbonization temperatures (>500° C.). Although $Cu^{2+}$-impregnated DNA filaments have been used to catalyze the growth of graphene nanoribbons, the degree of shape conservation was not reported. The present studies are the first to demonstrate precise shape conservation between the DNA templates and the resulting carbon nanostructures.

Herein, we demonstrate the fabrication of carbon nanostructures through high temperature (ca. 800° C.) shape-conserving carbonization of DNA nanostructures. With a thin $Al_2O_3$ film coating, a DNA nanostructure can be converted to carbon nanomaterial while preserving its nanoscale topography. Porous carbon material plays an important role in a wide range of applications, such aerospace structure, thermal management, fluorescent marker and energy storage.[32-40] The nanoscale structure of porous carbon material is essential to its mechanical, thermal, and electrical properties. For example, nanoscale hierarchical porous structures can be fabricated to show very high strength (modulus ~200 MPa) at low density (<100 $Kg/m^3$). Currently, the porous carbon materials are produced by carbonization of organic/polymer precursors in the presence of an inorganic template. The morphology of existing porous carbon materials is limited to simple periodic lattices. We also note that fabrication of 3D, irregular shaped carbon nanostructures is extremely challenging using existing approaches. Because DNA nanostructures (1D, 2D, and 3D) can be made into almost arbitrary shapes, our method has the potential to produce arbitrarily-shaped 1D, 2D, and 3D carbon nanostructures.

As illustrated in FIG. 1A, the carbonization procedure includes four primary actions or processes. First, a DNA nanostructure was deposited onto a Si wafer substrate. Then, a thin film (for example, having an approximately 20 nm thickness) of $Al_2O_3$ was conformally coated onto the DNA nanostructure and the Si substrate by, for example, atomic layer deposition (ALD). The $Al_2O_3$-coated DNA nanostructure was then annealed in a low-pressure $H_2$ atmosphere at high temperature (for example, in the range of 700 to 1000° C. or 800-1000° C.) for a period of time (for example, 3-5 minutes). Annealing converts the DNA nanostructures to carbon nanostructures. Finally, the $Al_2O_3$ coating may be removed by a $H_3PO_4$ etch to expose the carbon material for further characterizations. Two representative examples are discussed more in detail below.

Figure 1B:
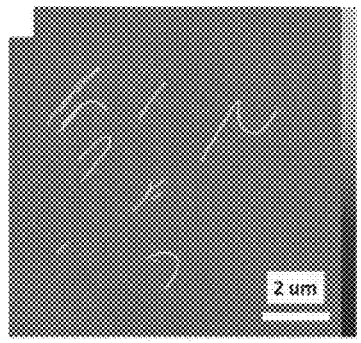
FIG. 1B illustrates an Atomic Force Microscopy (AFM) topographic image of a 1D DNA structure after deposition on top of Si substrate as set forth in FIG. 1A.
Figure 1C:
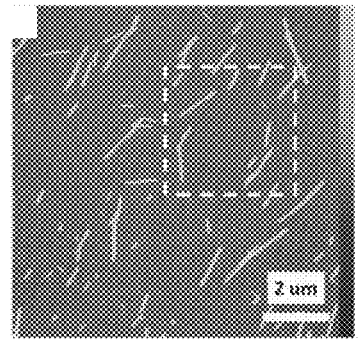
FIG. 1C illustrates an AFM topographic image after atomic layer deposition (ALD) of $Al_2O_3$ film as set forth in FIG. 1A.
Figure 1D:
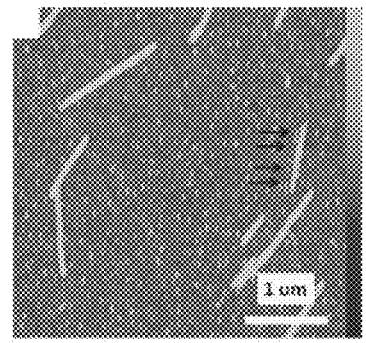
FIG. 1D illustrates an AFM topographic image after annealing at 800° C. for 5 min as set forth in FIG. 1A.
Figure 1E:
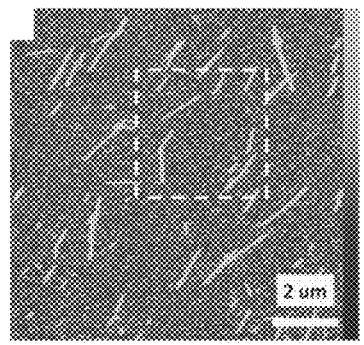
FIG. 1E illustrates an AFM topographic image after removal of $Al_2O_3$ film using $H_3PO_4$ as set forth in FIG. 1A.
Figure 1F:
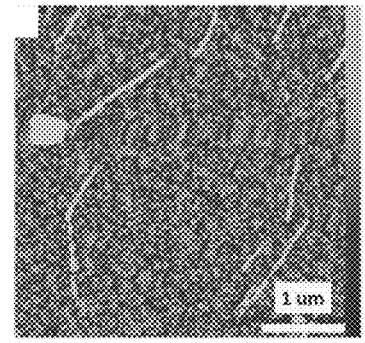
FIG. 1F illustrates an AFM topographic image after UV/Ozone (UVO) treatment as set forth in FIG. 1A, wherein the AFM images taken on the same location in FIGS. 1B through 1B.

In a number of studies, a 1D DNA brick crystal was constructed using a DNA brick approach. See, for example, Lee, J.; Kim, J.; Hyeon, T. Recent Progress in the Synthesis of Porous Carbon Materials. *Adv. Mater.* 2006, 18, 2073-2094, the disclosure of which is incorporated herein by reference. An AFM image of the DNA nanostructure is shown in FIG. 1B. The AFM images of FIGS. 1C-1F were taken on the same location. The structures are several micrometers in length, 10.1±0.6 nm in height and about 60±10 nm in width (measured from 10 different samples). After coating the sample with an approximately 20 nm of $Al_2O_3$ by ALD, the AFM image of the $Al_2O_3$ surface still showed the characteristic shape of the DNA nanostructure. The ALD coating process of DNA is thus a conformal coating process. Therefore, the topography of the DNA is propagated to the $Al_2O_3$ surface. We then thermally annealed the $Al_2O_3$-coated sample at 800° C. for 5 min. The highlighted portion of FIG. 1C and FIG. 1D show the same area of the sample before and after the thermal annealing, respectively. Comparing these two images, there was no change in the shape and relative position of the nanostructures. The melting point of $Al_2O_3$ is 2072° C. Thus, the $Al_2O_3$ provided a stable coating during the annealing process. We then removed the $Al_2O_3$ coating by a wet etching of $H_3PO_4$ to reveal the underlying carbon nanostructures. This etching technique is specific to $Al_2O_3$ and does not attack carbon or $SiO_2$. Any technique to remove the thin-film, protective layer should not significantly affect the carbon nanostructures or the substrate. The removal of $Al_2O_3$ was confirmed by X-ray photoelectron spectroscopy (XPS). After etching with $Al_2O_3$, the sample was again imaged by AFM at the same location as illustrated in FIG. 1E. The overall shape or conformation of the nanostructure is observed to be identical to that of the DNA template (FIG. 1C). Additional experiments, as further described below, demonstrated that these nanostructures are indeed made of carbon.

Figure 1G:
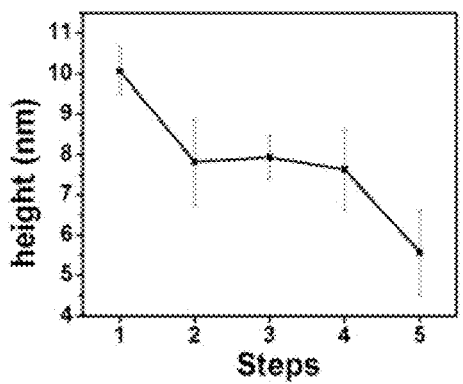
FIG. 1G illustrates the average height of 1-D DNA after each action or process as set forth in FIG. 1A.
Figure 1H:
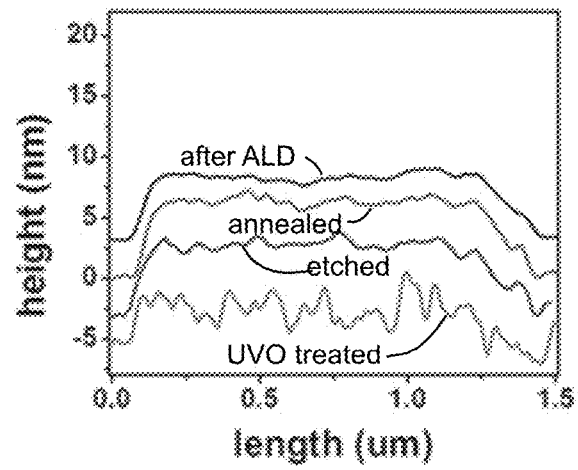
FIG. 1H illustrates the height profile of the 1D-DNA structure marked by arrows in FIG. 1D wherein the traces were shifted in the vertical axis for clarity.
Figure 1I:
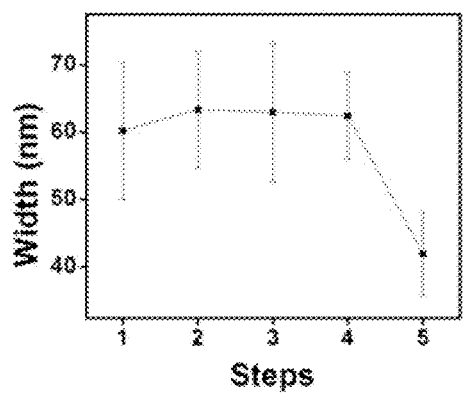
FIG. 1I illustrates the average width of 1-D DNA after each action or process as set forth in FIG. 1A, wherein, in FIGS. 1G and 1I, the horizontal axis represents the five following processes of the fabrication process: (1) after deposition on the Si substrate, (2) after ALD of $Al_2O_3$ film, (3) after annealing, (4) after removal of $Al_2O_3$ film and (5) after UV/Ozone treatment.

To quantify the degree of shape conservations, we measured the average height (as illustrated in FIG. 1G) of the nanostructures at each stage of the fabrication. A minor decrease of the height was observed after ALD coating (process 1 to process 2 in FIG. 1A). Without limitation to any mechanism, the reduction in height may arise from shrinkage of the DNA lattice interspace under $Al_2O_3$ film. Cross sections were measured on a piece of linear DNA crystal, as marked by arrows in FIG. 1D, after each processing step. The cross sections showed a high degree of similarity (see FIG. 1H), showing that the shape of DNA nanostructure is conserved from process 2 to process 4 (that is, ALD coating, thermal annealing, and removal of $Al_2O_3$). Finally, FIG. 1I shows that there was no change in the width of the nanostructures after carbonization and removal of $Al_2O_3$.

Figure 1J:
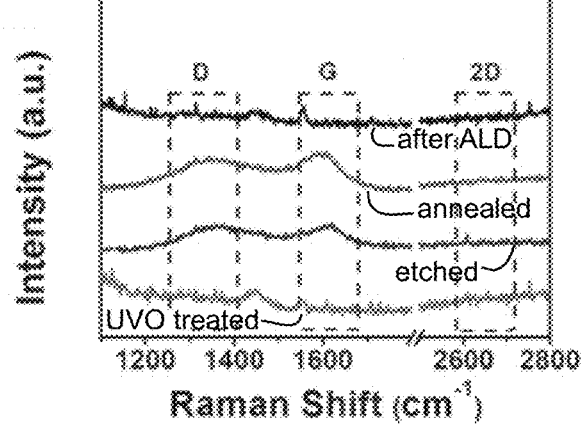
FIG. 1J illustrates Raman spectra of 1D-DNA, wherein the AFM height scale bars for 1D DNA are 10 nm and C-F were AFM images taken on the same location.

Micro-Raman spectroscopy was used to characterize the carbon nanomaterial produced by the carbonization procedure. The DNA nanostructure do not produce detectable Raman signal because of its small Raman cross section and low surface coverage. As shown in FIG. 1J, the sample became Raman active after thermal annealing. Both D band (1339 $cm^{-1}$) and G band (1611 $cm^{-1}$) peaks were observed. Both peaks are characteristic of carbon nanomaterials. The Raman signals persisted after the removal of $Al_2O_3$ layer, indicating that the Raman-active material was derived from DNA nanostructures underneath the $Al_2O_3$ film. The presence of G band confirms the formation of $sp^2$ hybridization of carbon materials (that is, graphitic carbon). The absence of a 2D band at approximately 2700 $cm^{-1}$ indicates the lack of a large scale of conjugated $sp^2$ carbon structure. The strong D band indicates the presence of defects in the DNA-derived carbon material. Without limitation, the D band may originate from several sources: presence of edges, formation of $sp^a$ carbon structure during annealing, and potentially doping by the heteroatoms in DNA (for example, nitrogen or N atoms). The $sp^2$ domain size was estimated to be approximately 8.1 nm according to the Tuinstra-Koenig relation. In the Tuinstra-Koenig relation, $I_D/I_G=C(\lambda)/L_a$, where the proportionality constant $C(\lambda)$ depends on the excitation laser wavelength $\lambda$. $C(\lambda)=2.4\times10^{-10}*\lambda^4$ (for peak-area intensities)=19.2 nm (for $\lambda$=532 nm). For 1D DNA crystals, the peak area intensity was 10149 for G peak and 23912 for D peak. Once again, the $sp^2$ domain size was determined to be $L_a$=8.1 nm. The $sp^2$ domain size estimated from the Raman data coincided with the height of the carbon nanostructure.

XPS was also used to further confirm the graphitic nature of the nanostructure product. After carbonization and removal of $Al_2O_3$, the C1s peak of the exposed carbon nanostructures shifted to lower binding energy from that of the as-deposited DNA. Deconvolution of the C1s peak identified that the largest contribution in as-deposited DNA sample came from the C—H components. After annealing, we observed a significant decrease in nitrogen content and the $sp^2$ C=C species increased from 22% to 70%, confirming that the shape-conserving carbonization produced graphitize carbon nanostructures.

To further confirm the formation of carbon nanostructures, we subjected the annealed sample to an UV/Ozone treatment after the removal of $Al_2O_3$. Both D and G bands disappeared (see FIG. 1J) after the UV/Ozone treatment. This observation is consistent with the expected oxidation of carbon material by UV/Ozone. Interestingly, the nanostructures were still visible by AFM and there was no change in their shape and relative position (FIG. 1F), although their average height and width decreased dramatically (FIGS. 1G and 1I). The height profile along an individual DNA crystal structure also showed significant increase of roughness (FIG. 1H). These results indicated that while the carbon materials were removed by UV/Ozone treatment, certain oxidation-resistant materials were left on the surface. Such residues may, for example, be inorganic salt from the buffer or thermal decomposition products of DNA.

Figure 2A:
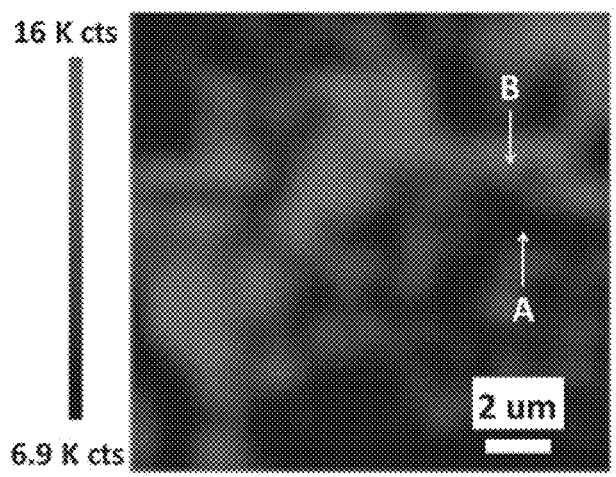
FIG. 2A illustrates a map of integrated intensity of the G peak region (1531 to 1661 $cm^{-1}$), wherein linear features of several micrometers in length were observed.
Figure 2B:
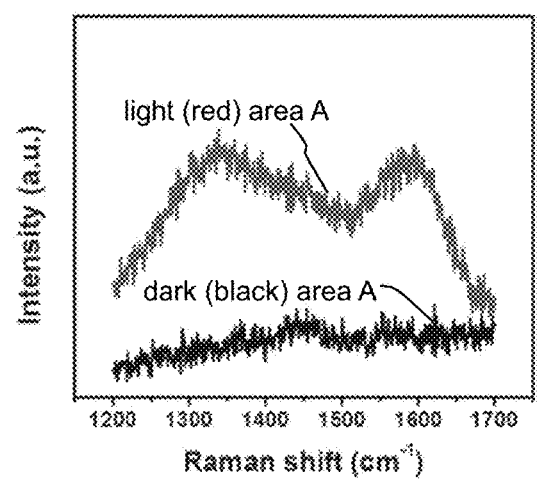
FIG. 2B illustrates two representative Raman spectra, one taken from the linear feature and another from a spot nearby that was Raman-inactive.

Finally, to confirm that the Raman activity was a result the annealed DNA nanostructure, we carried out confocal Raman mapping of the annealed 1D DNA crystal sample over a 10×10 µm area. FIG. 2A shows the map of integrated intensity of the G peak region (1531 to 1661 $cm^{-1}$), where linear features of several micrometers in length were observed. FIG. 2B shows two representative Raman spectra, one taken from the linear feature and another from a spot nearby that was Raman-inactive. Only the spectrum from the linear structure showed Raman features characteristic of carbon. Those linear structures are consistent with the dimension of the DNA nanostructures measured by AFM (FIGS. 1A through 1E), providing direct evidence that the DNA-to-carbon nanostructure transformation is shape-conserving.

Following the successful shape conserving carbonization of the simple linear DNA crystal, further studies were made to extend the methodology to more complex DNA structures. In a number of representative studies, triangle-shaped DNA nanostructures, with a height of 1.6±0.2 nm and a width of 28.6±5.2 nm on the edge, were selected for their unique structural features (for example, linear sides, central void and sharp tips) as well as their resistance to aggregation. Unlike the 1D DNA crystal, which includes 6 overlapping layers of double-stranded DNA, the DNA triangle is made of just one layer of ds-DNA. Considering the carbonization yield of sugars at 800° C. is only approximately 30%, studies were made to determine if a continuous carbon nanostructure can be derived from only one layer of ds-DNA.

Figure 3F:
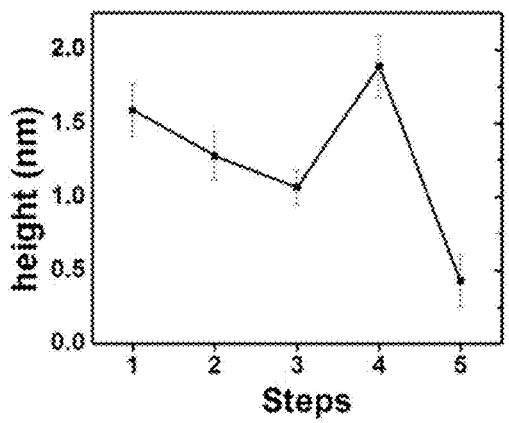
FIG. 3F illustrates average height of DNA triangles at each process.
Figure 3G:
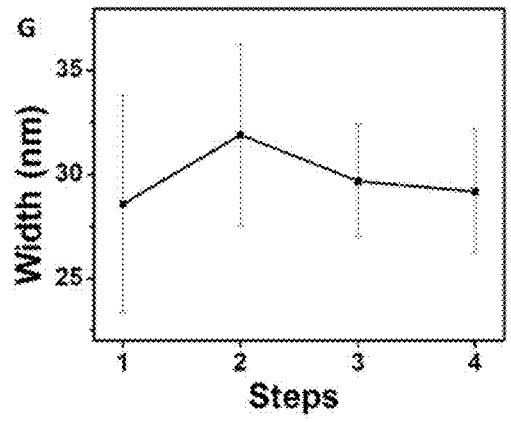
FIG. 3G illustrates average width of DNA triangles at each process.

Similar to the case of 1D DNA crystals, DNA triangles retained their shape after a series of harsh treatments, including ALD, annealing at 800° C. for 5 min and removal of $Al_2O_3$ by $H_3PO_4$ etching (see FIG. 3A-3D). The average width of the triangle edges changed less than 4% (FIG. 3G), indicating that the DNA nanostructure was well confined during the carbonization procedure. The average height decreased slightly after ALD (from 1.6±0.2 nm to 1.3±0.2 nm) and annealing (to 1.1±0.2 nm), but increased (to 1.9±0.2 nm) unexpectedly after the removal of $Al_2O_3$ (see FIG. 3F). It is known that the apparent height measured by AFM is sensitive to the tip-substrate interaction and may deviate from the actual height by as much as 1 nm, especially in cases where the sample and the substrate are chemically different (for example, carbon vs $SiO_2$). High resolution AFM image was taken after the removal of $Al_2O_3$ film. The image presented a continuous, intact triangular nanostructure with a central void (see FIG. 3D, inset).

Figure 3H:
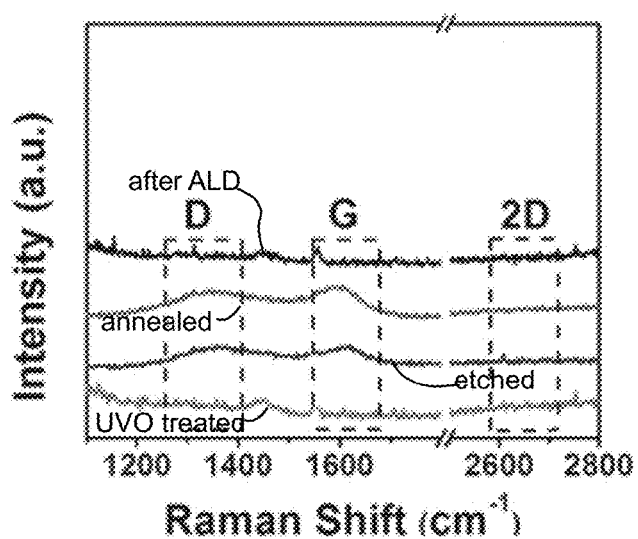
FIG. 3H illustrates Raman spectra of DNA triangle at each process.

Micro-Raman spectroscopy was conducted to detect the presence of carbon materials at each step. Similar to the case of 1D DNA crystal, the DNA triangles sample became Raman active after annealing at high temperature, showing clear D and G bands. Such Raman features were still observed after the removal of $Al_2O_3$ coating (see FIG. 3H), indicating successful carbonization of DNA material. After exposure to UV/Ozone, the triangle-shaped nanostructure (FIG. 3E) disappeared along with the D and G bands in the Raman spectra (FIG. 3H), proving that the triangular nanostructures in FIG. 3D were indeed made of carbon. In a control experiment, we also treated the samples with UV/Ozone before removing the $Al_2O_3$ coating. In those studies, we observed no change in the Raman activity and AFM topography of the sample. These control experiments showed that the carbon material was underneath the $Al_2O_3$ film and that the $Al_2O_3$ coating protects the carbon material from oxidation by $O_3$.

This shape conserving carbonization approach is compatible with other DNA templates as well. As another example, we show that a large 2D DNA crystal, prepared using the DNA brick approach, maintained its shape after the carbonization. AFM images of the 2D DNA crystal, before and after thermal annealing; showed the height profiles present similar surface features, with the same height of 1.82±0.15 nm. The Raman spectrum showed that D and G bands appeared after annealing. In addition, Raman mapping showed that the Raman activities originate from micron-sized objects whose dimensions are similar to that of the 2D DNA structures. This data again demonstrates that the carbonization of DNA nanostructure is a shape-conserving process.

With a thicker 2D DNA crystal of 11.3±0.4 nm in height, we obtained carbonized structures with a height of 7.3±0.7 nm after annealing and removal of $Al_2O_3$. The electrical properties of this carbon nanostructure were measured using conductive AFM. With an electrical bias of 2 V, the current measured on the carbon nanostructure is 0.28±0.03 nA, which is higher than that of the Si substrate. Given that the Si substrate is covered by a native oxide layer after the removal of $Al_2O_3$, this result indicates that the DNA-derived carbon nanostructure is conductive to a certain degree. Although only nA level of current was observed in the conductive AFM measurements, this current may be limited by contact resistance between the AFM tip and the sample. Thus, the intrinsic conductivity of the carbon nanostructure may be much higher.

Figure 4A:
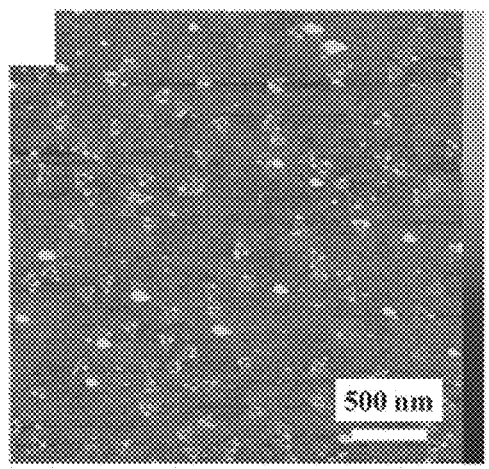
FIG. 4A illustrates an AFM image of the annealed Si/DNA with an $Al_2O_3$ film.
Figure 4B:
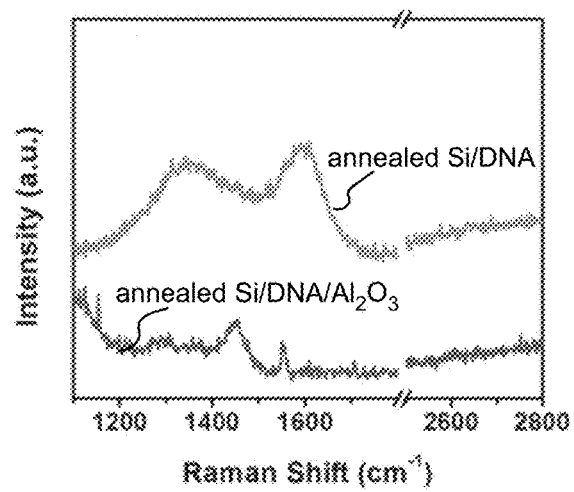
FIG. 4B illustrates Raman spectra of annealed Si/DNA with and without an $Al_2O_3$ film.

The inorganic oxide thin film hereof (for example, a 20 nm $Al_2O_3$ film) is important in the carbonization of organic matter while maintaining the conformation thereof. In a control experiment, we annealed a DNA triangle sample without the $Al_2O_3$ film. Although triangular shaped structures were still observed after annealing (as illustrated in FIG. 4A), they are significantly lower (0.58±0.14 nm) in height, and there was no D and G band observed (see the lower line of FIG. 4B). It is believed that this Raman-inactive structure is the salt residue following decomposition of DNA. In contrast, in the presence of $Al_2O_3$ film even a single layer of ds-DNA is capable of producing carbon material (see the upper line of FIG. 4B) and preserving its nanoscale morphology. The control experiments hereof also showed that an approximately 20 nm of $Al_2O_3$ coating is impermeable to gas at room temperature. In a number of embodiments hereof, the thin film of inorganic oxide is impermeable to gas in which the annealing occurs and/or to gases produced from carbonization of the organic material. Without limitation to any mechanism, it is postulated that, in addition to preserving the shape of the nanostructure, the thin-film coating (for example, a $Al_2O_3$ coating) also prevents or slows down the decomposition products of DNA from escaping. As a result, the thin film increases the carbonization yield.

Figure 4C:
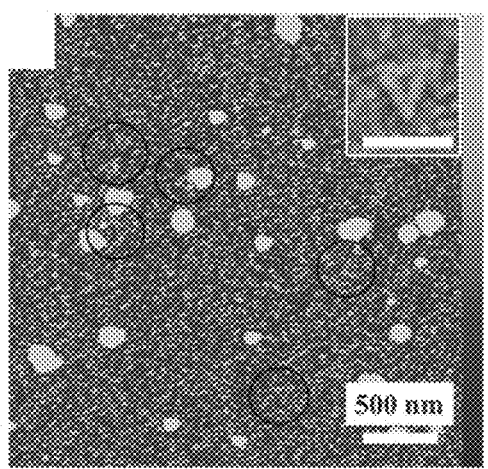
FIG. 4C illustrates an AFM image of the annealed Si/DNA without an $Al_2O_3$ film, wherein; the scale bar for the inset of FIG. 4C is 200 nm, and the circles in FIG. 4C indicate location of carbon nanostructures.
Figure 4D:
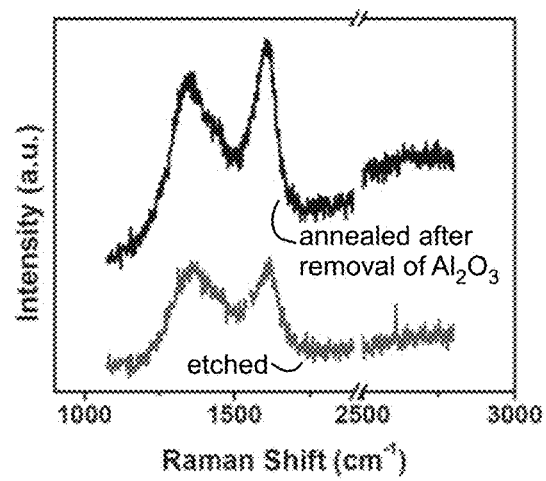
FIG. 4D illustrates a comparison of the exposed carbon material before and after the second annealing.

With the $Al_2O_3$ coating removed, the carbon nanostructure broke down to small particles after heating at 800° C. for 5 min (see FIG. 4C), indicating poor stability of graphitic structures at high temperature, which may be a result of enhanced diffusion. However, storing an annealed sample (with $Al_2O_3$ removed) at room temperature did not lead to degradation of the nanostructure, as determined by AFM images and Raman spectra taken on the same sample. Finally, additional experiments showed that the carbon nanostructures are stable upon repeated AFM imaging and is not affected by laser induced heating in the time scale of Raman measurements.

In further studies, the annealing conditions were systematically varied to study the effect of temperature, duration and gas environment on the carbonization. To understand the effect of temperature, we carbonized the triangle DNA nanostructure at 780° C., 800° C. and 1000° C. In all three cases, the Raman spectra showed clear D and G bands, indicating that the carbonization occurred over a wide temperature range. To evaluate the effect of annealing time, two $Al_2O_3$-coated DNA triangle samples were annealed at 800° C. for 5 min and 20 min, respectively. Raman spectra and AFM images showed that in both cases, shape/conformation conserving carbonization occurred. Additionally, the same 1D DNA crystal sample was annealed at 800° C. for 5 min and then subjected to 1000° C. annealing for another 3 min. AFM topography images and height profiles indicated remarkable preservation of nanostructure. Also, Raman spectra showed D and G peaks after both annealing processes. These results demonstrate that the carbonization was completed within 5 minutes, and the carbon structure can be preserved at high temperature during extended heat treatment, owing to the high melting point of $Al_2O_3$ film. The effect of gas environment was studied by heating the $Al_2O_3$/DNA/Si samples in $H_2$, Ar and air at 800° C. for 5 min. In the case of $H_2$ and Ar, the Raman spectra show apparent D and G peaks, while no graphitic signal was observed from the samples annealed in air. Furthermore, for the sample annealed in $H_2$, we subject it to a second annealing in air at 800° C. for another 5 min, and the D and G peaks vanished. Compared with the previous demonstration of additional annealing in $H_2$ atmosphere, the results indicate that the carbonization procedure should be carried out in inert atmosphere since the $Al_2O_3$ film was not impermeable to $O_2$ at high temperature, although it does provide protection against $UV/O_3$ oxidation.

Carbon source other than DNA nanostructure could be introduced during the carbonization process. Possible non-DNA carbon source include the airborne carbon contamination, the byproduct of ALD, and the buffer solution used for DNA deposition. Control experiments were conducted to determine the possible contribution from all these sources, as described below.

A Raman spectrum taken from annealed $Al_2O_3$/Si, which was prepared from direct deposition of $Al_2O_3$ on a blank Si surface (without DNA), showed no D or G peak, indicating the ALD product residue and airborne carbon contaminations do not produce carbon material. Similarly, we found that the buffer solution did not introduce a significant amount of carbon precursor. During the deposition of the 1D DNA crystals, the Si wafer was rinsed with water after the DNA deposition. A control sample was prepared by soaking a Si wafer in a DNA-free buffer solution, followed by rinsing the wafer with water. This sample was then coated with $Al_2O_3$. No carbon material was detected by Raman spectroscopy after thermal annealing. The preparation for DNA triangle and 2D DNA crystal samples involve rinsing with an ethanol-water mixture. In this case, a control sample (Si wafer soaked in DNA-buffer, then rinsed with ethanol-water mixture) showed weak D and G peaks in the Raman spectrum after ALD coating and annealing. However, the Raman signal intensity was only 22%-27% of that from samples having deposited 1D and 2D DNA crystals.

Experimental

Preparation of DNA Nanostructure on Si Substrate

Preparation of DNA nanostructure: Synthetic and M13mp18 DNA for preparing the DNA triangle origami were purchased from IDT and New England Biolabs, respectively. The 2D DNA triangles was formed by heating the DNA solution to 95° C. followed by a slow cooling to 25° C. in 24 hrs. The resulting solution was purified by centrifuging 6 times to remove the extra short strands. DNA solution was made from TAE/Mg buffer solution (12.5 mM $Mg(OAc)_2$, 40 mM Tris, 20 mM acetic acid and 2 mM EDTA). 1D-DNA crystals and 2D DNA crystals were prepared using the DNA brick approach. The buffer solution contains 40 mM $Mg^{2+}$.

Deposition of DNA nanostructure on Si wafer: Silicon wafers were purchased from University Wafers. It was cleaned with hot piranha solution (7:3 (v/v) of concentrated $H_2SO_4$: 35% $H_2O_2$). Triangular DNA origami was assembled on the substrate by dripping 2 μL of DNA solution on the substrate and waiting for 40 min before blow away the solution. The substrate was immersed in a 9/1 (v/v) ethanol/water solution to remove the salt from the buffer solution. 1D-DNA was assembled by dripping 2 μL of DNA solution for 4 min and then washing with 400 deionized water. After the deposition of DNA, the substrate was preceded to the deposition step within one day.

Deposition of Protective Inorganic Film

Atomic layer deposition (ALD) of $Al_2O_3$ on DNA/Si substrate: We used trimethylaluminum as precursor. The chamber and substrate heaters were set to 200° C. and the Throttle valve position was set to give 200 mtorr at 260 sccm total Ar flow. The deposition looped 200 times of 0.006 s TMA pulse, 10 s interval, 0.06 s $H_2O$ pulse and 10 s interval. The pre-set deposition thickness of both oxide films was 20 nm and the experimental thickness of the film was measured by ellipsometry. The surface of the sample was imaged using tapping mode AFM. Surprisingly, the DNA nanostructures survived the relatively harsh conditions of ALD while maintaining their original conformation.

Annealing Experiment

Typically, the prepared sandwich-like substrate was placed at the center of quartz plate in a 1-inch-diameter fused quartz tube. The furnace tube was evacuated and $H_2$ gas flowed at speed of 2.0 standard cubic centimeters per minute (sccm) with a pressure of 70 mTorr for 5 min. Then the furnace was heated to 800° C. under a 2.0 sccm of $H_2$. Time was recorded when the temperature reach the setting value. Then the substrate was cooled to room temperature under $H_2$ gas flow and taken out from the tube furnace.

Etching Experiment

The $Al_2O_3$ film was etched in the 4.56 M $H_3PO_4$ solution for 1 hour, followed by rinsing with 1 M $H_3PO_4$ and $H_2O$. The etching procedure was studied on the annealed $Al_2O_3$/$SiO_2$ wafer and the etching rate is about 0.3 nm/sec.

UV-Ozone Experiment

The substrate was subjected in the NOVASCAN® PSD Pro Series UV-Ozone cleaner for UVO treatment (available from Novascan Technologies, Inc. of Ames, Iowa). The UV/O3 chamber was flushed with oxygen for 5 min before UV irradiation. The typical duration for the treatment was 60 min.

Characterization Methods

Raman spectroscopy: Typically, the Raman spectra were measured using an ANDOR iDus® Raman microscope (available from Andor Technology LTD of Belfast, North Ireland) equipped with solid state 532 nm laser (2.33 eV) with a spot size of ~1 μm (through a 40× lens). Each Raman trace was taken with 20 to 600 seconds integration time under a low incident laser power of 1.2-1.4 mW, thus the heating effects can be neglected.

Confocal Raman mapping: The confocal Raman mapping was performed using Renishaw inVia Raman microscope, with 633 nm laser excitation. The spatial step was 0.5 μm, and the integration time for each spot was 10 sec. The laser power was 1.7 mW and the grating was 1800l/mm.

Atomic force microscopy: Surface morphology was measured using tapping mode atomic force microscopy (AFM) using a VEECO® Dimension 3100 scanning probe microscope (available from VEECO Instruments Inc.) or an ASYLUM RESEARCH® MFP-3D atomic force microscope (available from Oxford Instruments Research, Inc. of Santa Barbara, Calif.) with μMasch® NSC15 AFM tips (available from MikroMasch USA of Watson, Calif.) in air. Contact mode and conductive AFM images were taken on an ASYLUM RESEARCH® MFP-3D AFM using an ORCA™ module (available from Oxford Instruments Research, Inc.) and BUIDGETSENSORS® Tap300E-G AFM tips (available from Innovative Solutions Bulgaria, Ltd. Of Sofia, Bulgaria) in air.

Ellipsometry: Thickness measurements of the oxide film were carried out on an alpha-SE® Ellipsometer. The literature refractive index value of $SiO_2$, $Al_2O_3$ was 1.450 and 1.921 respectively. The refractive index was also measured by using Cauchy self-fitting model.

X-Ray Photoelectron Spectroscopy (XPS): XPS was conducted in the ESCALAB™ 250XI XPS microscope (available from Thermo Fisher Scientific of Cleveland, Ohio). Deconvolution of the C1s peak was calculated using XPSPEAK 4.1 software (freeware). We note that the carbon XPS data should be interpreted with caution because airborne hydrocarbon could contaminate the surface. This contamination is known to occur on $SiO_2$ surface; we recently also reported that the contamination occurs on graphitic surface as well.

The foregoing description and accompanying drawings set forth a number of representative embodiments at the present time. Various modifications, additions and alternative designs will, of course, become apparent to those skilled in the art in light of the foregoing teachings without departing from the scope hereof, which is indicated by the following claims rather than by the foregoing description. All changes and variations that fall within the meaning and range of equivalency of the claims are to be embraced within their scope.

What is claimed is:

1. A method of forming a carbonized composition, comprising:
   providing an organic composition comprising a nucleic acid;
   forming a protective layer over the organic composition;
   increasing temperature to carbonize the organic composition and for a period of time to form the carbonized composition; and
   removing the protective layer from the carbonized composition.

2. The method of claim 1 wherein the organic composition consists of a nucleic acid.

3. The method of claim 1 wherein the nucleic acid is DNA.

4. The method of claim 1 wherein the nucleic acid is formed to have a predetermined shape or conformation.

5. The method of claim 4 wherein the predetermined shape or conformation of the nucleic acid is substantially maintained in the carbonized composition.

6. The method of claim 5 wherein the nucleic acid is deposited upon a substrate before forming the protective layer over the organic composition.

7. The method of claim 1 wherein the carbonized composition is a porous carbon material.

8. The method of claim 1 wherein the temperature is increased to a temperature within the range of approximately 780° C. to approximately 2072° C.

9. The method of claim 1 wherein the protective layer is deposited via a thin film deposition technique.

10. The method of claim 9 wherein the protective layer is deposited via atomic layer deposition, vacuum deposition, sputtering, chemical vapor deposition or laser assisted deposition.

11. The method of claim 10 wherein the protective layer is deposited via atomic layer deposition.

12. The method of claim 9 wherein the thickness of the protective layer is in the range of 2 nm to 100 micrometers.

13. The method of claim 1 wherein the protective layer comprises $Al_2O_3$.

14. The method of claim 13 wherein the protective layer is removed via etching with $H_3PO_4$.

15. The method of claim 1 wherein the protective layer is impermeable to decomposition gases of the organic composition during carbonization.

\* \* \* \* \*